(12) United States Patent
Lindell et al.

(10) Patent No.: US 10,838,000 B2
(45) Date of Patent: Nov. 17, 2020

(54) METHOD AND APPARATUS FOR SIMULTANEOUSLY TESTING A COMPONENT AT MULTIPLE FREQUENCIES

(71) Applicant: NATIONAL INSTRUMENTS CORPORATION, Austin, TX (US)

(72) Inventors: Blake A. Lindell, Round Rock, TX (US); Pablo E. Limon-Garcia-Viesca, Cedar Park, TX (US)

(73) Assignee: National Instruments Corporation, Austtin, TX (US)

( * ) Notice: Subject to any disclaimer, the term of this patent is extended or adjusted under 35 U.S.C. 154(b) by 320 days.

(21) Appl. No.: 15/922,051

(22) Filed: Mar. 15, 2018

(65) Prior Publication Data

US 2018/0267096 A1 Sep. 20, 2018

Related U.S. Application Data

(60) Provisional application No. 62/471,471, filed on Mar. 15, 2017.

(51) Int. Cl.
| | |
|---|---|
| *G01R 31/28* | (2006.01) |
| *G01R 27/26* | (2006.01) |
| *G01R 1/30* | (2006.01) |
| *H03M 1/10* | (2006.01) |
| *G01R 19/00* | (2006.01) |
| *G01R 23/16* | (2006.01) |

(52) U.S. Cl.
CPC ........... *G01R 31/2837* (2013.01); *G01R 1/30* (2013.01); *G01R 27/26* (2013.01); *H03M 1/1071* (2013.01); *G01R 19/0007* (2013.01); *G01R 23/16* (2013.01)

(58) Field of Classification Search
CPC ...... G01R 31/2837; G01R 1/30; G01R 27/26; G01R 23/16; G01R 19/0007; H03M 1/1071
See application file for complete search history.

(56) References Cited

U.S. PATENT DOCUMENTS

| | | |
|---|---|---|
| 9,176,187 B2 | 11/2015 | Yeh |
| 9,293,074 B2 | 3/2016 | Tajika |
| 9,310,425 B2 | 4/2016 | Jiun-Jie |
| 9,646,657 B2 | 5/2017 | Schmidt |

(Continued)

*Primary Examiner* — Amy He
(74) *Attorney, Agent, or Firm* — Kowert Hood Munyon Rankin and Goetzel PC; Jeffrey C. Hood; Erik A. Heter

(57) ABSTRACT

A method and apparatus for simultaneously testing a component at multiple frequencies is disclosed. A digital processing circuit may generate a digital representation of a signal having a plurality of sine waves, each having a unique frequency. The digital representation may be converted into an analog signal, and applied to a device under test (DUT). A first analog-to-digital converter (ADC) may be coupled to measure voltages across the DUT, while a second ADC may be coupled to measure currents through the DUT. Voltage and current signals received by the first and second ADCs, respectively, may be converted into first and second digital values. Voltage and current values at each unique frequency are determined from the first and second digital values. Using the voltage and current values for each unique frequency, a frequency response of the component (e.g., an impedance) over a range of frequencies may be determined.

20 Claims, 8 Drawing Sheets

(56) References Cited

U.S. PATENT DOCUMENTS

| | | | |
|---|---|---|---|
| 2009/0121908 A1* | 5/2009 | Regier | G01R 31/2841 341/142 |
| 2015/0156003 A1* | 6/2015 | Khandani | H04L 5/143 370/278 |
| 2015/0168529 A1* | 6/2015 | Regier | G01R 35/005 324/601 |

* cited by examiner

METHOD AND APPARATUS FOR SIMULTANEOUSLY TESTING A COMPONENT AT MULTIPLE FREQUENCIES

PRIORITY INFORMATION

This application claims priority to U.S. provisional patent application Ser. No. 62/471,471, entitled "Method and Apparatus for Simultaneously Testing a Component at Multiple Frequencies", filed Mar. 15, 2017, and which is hereby incorporated by reference in its entirety as though fully and completely set forth herein.

BACKGROUND

Technical Field

This disclosure is directed to testing electronic components, and more particularly to the simultaneous or concurrent testing of a component at multiple frequencies.

Description of the Related Art

Many electronic components have electrical parameters that are frequency dependent, i.e., their response is dependent on the frequency of a signal applied thereto. For example, the impedance of a capacitor is frequency dependent, typically decreasing from a frequency of 0 Hz to a minimum at some resonant frequency, and then subsequently increasing for frequencies above that. Understanding the frequency response of selected components may enable testing of underlying device physics or performance binning.

Measuring the frequency response of a component having a frequency dependent electrical parameter may be performed by applying signals at various frequencies. A signal, or tone, having a first frequency and magnitude (e.g., a programmed voltage) may be applied, while another parameter (e.g., resultant current through the component) may be measured. This process may be repeated for a number of different frequencies. After enough measurements have been made at a sufficient number of frequencies to obtain the desired information, the frequency response can then be characterized.

SUMMARY

A method and apparatus for simultaneously testing a component at multiple frequencies is disclosed. In one embodiment, a digital processing circuit may generate a digital representation of a signal having a plurality of sine waves, each having a unique frequency. The digital representation may be converted into an analog signal, and applied to a device under test (DUT). A first analog-to-digital converter (ADC) may be coupled to measure voltages across the DUT, while a second ADC may be coupled to measure currents through the DUT. Voltage and current signals received by the first and second ADCs, respectively, may be converted into first and second digital values. Voltage and current values at each unique frequency are determined from the first and second digital values. Using the voltage and current values for each unique frequency, a frequency response of the component (e.g., an impedance) over a range of frequencies may be determined.

In one embodiment, digital processing circuitry (e.g., a processor in a general purpose computer) may generate a digital representation of a signal having a plurality of different frequency components. The digital representation may be converted into an analog test signal by a DAC, and applied to the DUT. Since the analog signal includes a multitude of different frequency components, these components are thus applied to the DUT simultaneously. Voltage and current responses are measured in the analog domain, and converted into digital form. Since the voltage and current responses in the analog domain include the frequency components of the analog test signal, frequency response over a range of frequencies can be computed based on only a single application of the test signal.

BRIEF DESCRIPTION OF THE DRAWINGS

The following detailed description makes reference to the accompanying drawings, which are now briefly described.

Figure 1:
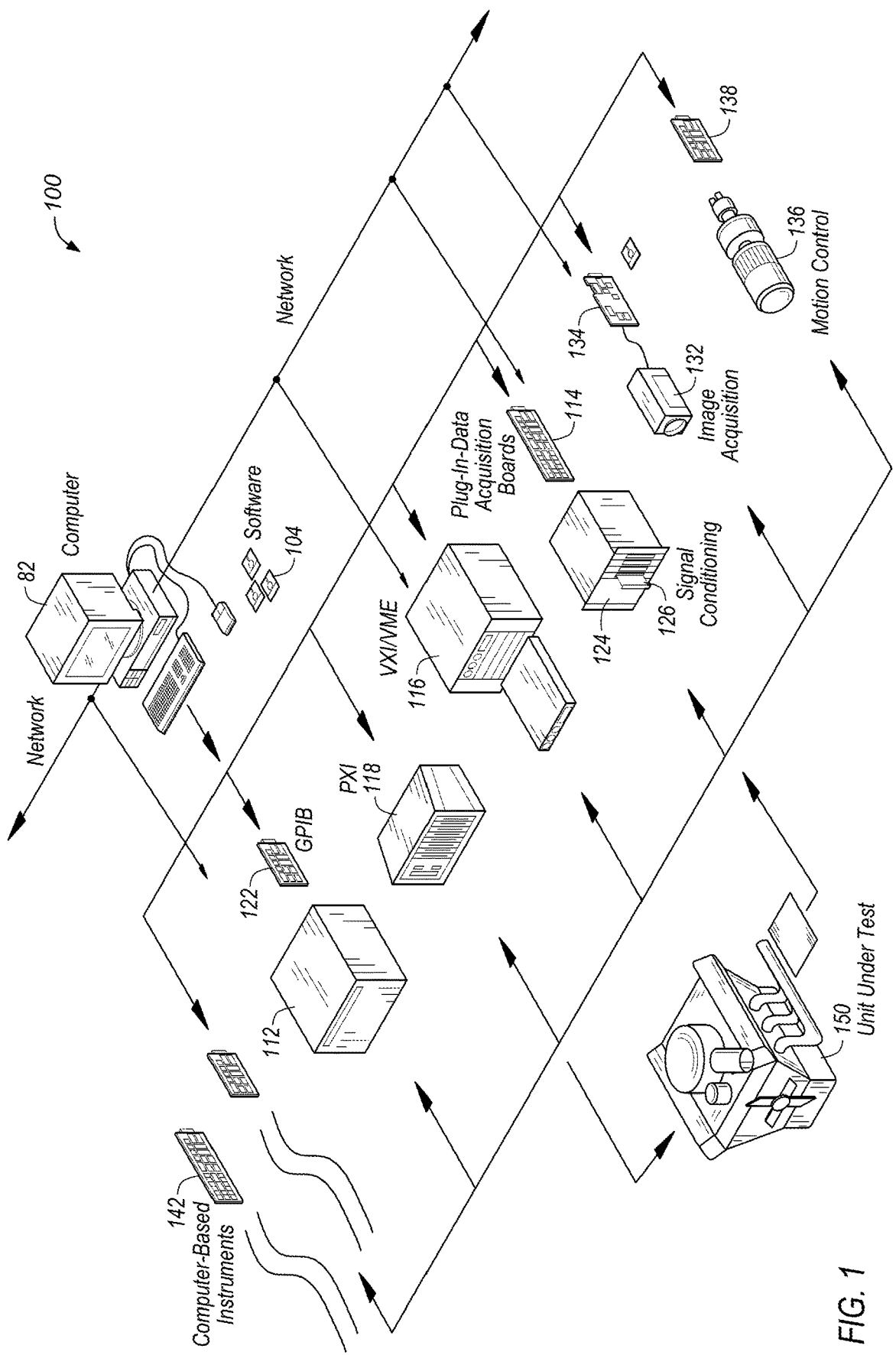
FIG. 1 illustrates one embodiment of an instrumentation control system with instruments networked together.

Although the embodiments disclosed herein are susceptible to various modifications and alternative forms, specific embodiments are shown by way of example in the drawings and are described herein in detail. It should be understood, however, that drawings and detailed description thereto are not intended to limit the scope of the claims to the particular forms disclosed. On the contrary, this application is intended to cover all modifications, equivalents and alternatives falling within the spirit and scope of the disclosure of the present application as defined by the appended claims.

This disclosure includes references to "one embodiment," "a particular embodiment," "some embodiments," "various embodiments," or "an embodiment." The appearances of the phrases "in one embodiment," "in a particular embodiment," "in some embodiments," "in various embodiments," or "in an embodiment" do not necessarily refer to the same embodiment. Particular features, structures, or characteristics may be combined in any suitable manner consistent with this disclosure.

Within this disclosure, different entities (which may variously be referred to as "units," "circuits," other components, etc.) may be described or claimed as "configured" to perform one or more tasks or operations. This formulation [entity] configured to [perform one or more tasks] is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "credit distribution circuit configured to distribute credits to a plurality of processor cores" is intended to cover, for example, an integrated circuit that has circuitry that performs this function during operation, even if the integrated circuit in question is not currently being used (e.g., a power supply is not connected to it). Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function, although it may be "configurable to" perform that function after programming.

Reciting in the appended claims that a structure is "configured to" perform one or more tasks is expressly intended not to invoke 35 U.S.C. § 112(f) for that claim element. Accordingly, none of the claims in this application as filed are intended to be interpreted as having means-plus-function elements. Should Applicant wish to invoke Section 112(f) during prosecution, it will recite claim elements using the "means for" [performing a function] construct.

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

As used herein, the phrase "in response to" (or "responsive to") describes one or more factors that trigger an effect. This phrase does not foreclose the possibility that additional factors may affect or otherwise trigger the effect. That is, an effect may be solely in response to those factors, or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

As used herein, the terms "first," "second," etc. are used as labels for nouns that they precede, and do not imply any type of ordering (e.g., spatial, temporal, logical, etc.), unless stated otherwise. For example, in a register file having eight registers, the terms "first register" and "second register" can be used to refer to any two of the eight registers, and not, for example, just logical registers 0 and 1.

When used in the claims, the term "or" is used as an inclusive or and not as an exclusive or. For example, the phrase "at least one of x, y, or z" means any one of x, y, and z, as well as any combination thereof.

In the following description, numerous specific details are set forth to provide a thorough understanding of the disclosed embodiments. One having ordinary skill in the art, however, should recognize that aspects of disclosed embodiments might be practiced without these specific details. In some instances, well-known circuits, structures, signals, computer program instruction, and techniques have not been shown in detail to avoid obscuring the disclosed embodiments.

DETAILED DESCRIPTION OF EMBODIMENTS

FIG. 1 illustrates an exemplary instrumentation control system 100 which may be configured according to embodiments of the present invention. System 100 comprises a host computer 82 which may couple to one or more instruments configured to perform a variety of functions using timing control implemented according to various embodiments of the present invention. Host computer 82 may comprise a CPU, a display screen, memory, and one or more input devices such as a mouse or keyboard as shown. Computer 82 may operate with one or more instruments to analyze, measure, or control a unit under test (UUT) or process 150. The one or more instruments may include a GPIB instrument 112 and associated GPIB interface card 122, a data acquisition board 114 inserted into or otherwise coupled with chassis 124 with associated signal conditioning circuitry 126, a VXI instrument 116, a PXI instrument 118, a video device or camera 132 and associated image acquisition (or machine vision) card 134, a motion control device 136 and associated motion control interface card 138, and/or one or more computer based instrument cards 142, among other types of devices.

The computer system may couple to and operate with one or more of these instruments. In some embodiments, the computer system may be coupled to one or more of these instruments via a network connection, such as an Ethernet connection, for example, which may facilitate running a high-level synchronization protocol between the computer system and the coupled instruments. The instruments may be coupled to the unit under test (UUT) or process 150, or may be coupled to receive field signals, typically generated by transducers. System 100 may be used in a data acquisition and control applications, in a test and measurement application, an image processing or machine vision application, a process control application, a man-machine interface application, a simulation application, or a hardware-in-the-loop validation application, among others.

Figure 2:
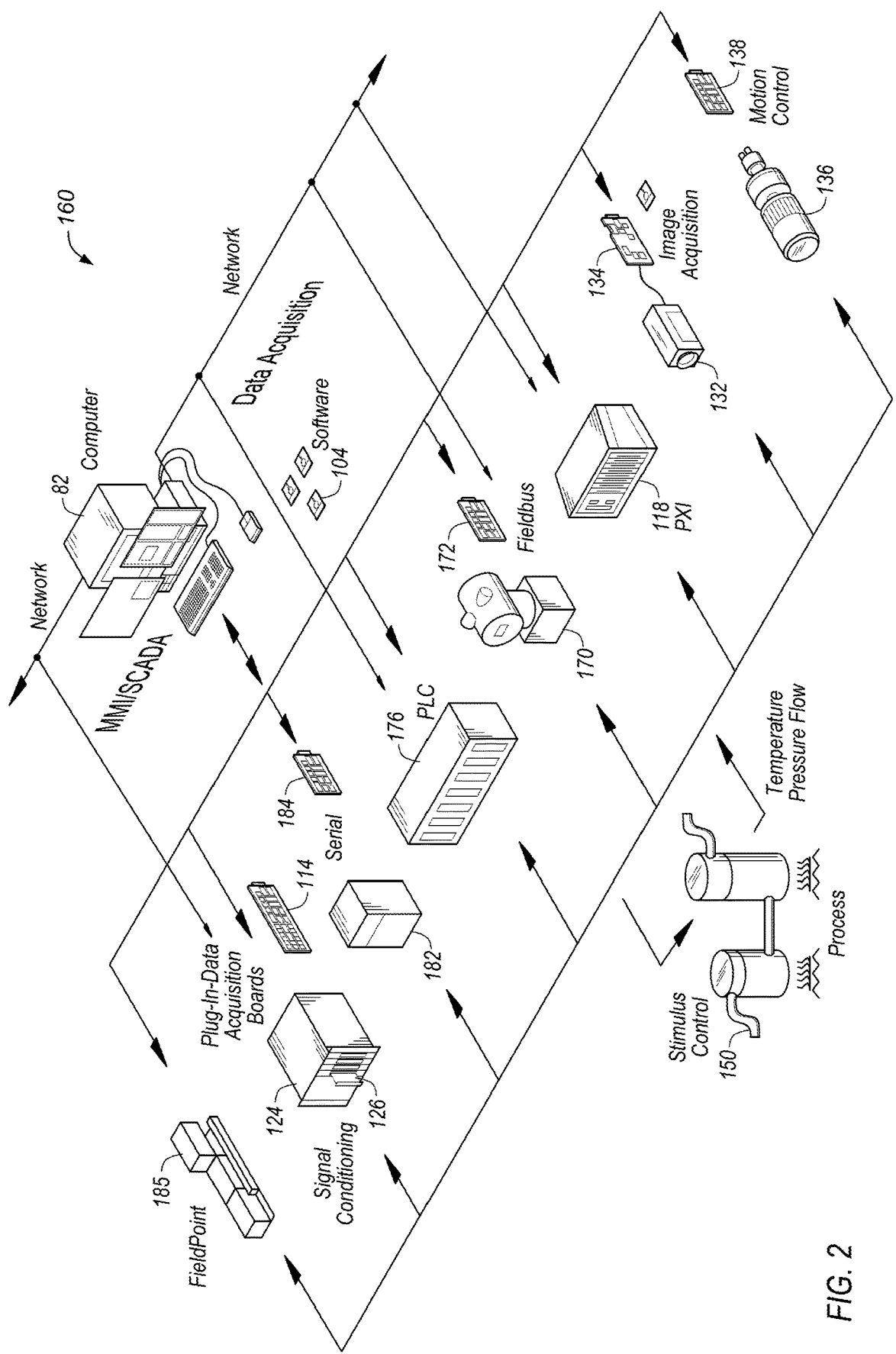
FIG. 2 illustrates one embodiment of an industrial automation system with instruments networked together.

FIG. 2 illustrates one embodiment of an exemplary industrial automation system 160. Industrial automation system 160 may be similar to instrumentation or test and measurement system 100 shown in FIG. 2. Elements that are similar or identical to elements in FIG. 1 have the same reference numerals for convenience. System 160 may comprise a computer 82 which may couple to one or more devices and/or instruments configured to perform a variety of functions using timing control implemented according to various embodiments of the present invention. Computer 82 may comprise a CPU, a display screen, memory, and one or more input devices such as a mouse or keyboard as shown. Computer 82 may operate with the one or more devices and/or instruments to perform an automation function, such as MMI (Man Machine Interface), SCADA (Supervisory Control and Data Acquisition), portable or distributed data acquisition, process control, and advanced analysis, among others, on process or device 150.

The one or more devices may include a data acquisition board 114 inserted into or otherwise coupled with chassis 124 with associated signal conditioning circuitry 126, a PXI instrument 118, a video device 132 and associated image acquisition card 134, a motion control device 136 and associated motion control interface card 138, a field bus device 170 and associated field bus interface card 172, a PLC (Programmable Logic Controller) 176, a serial instrument 182 and associated serial interface card 184, or a distributed data acquisition system, such as the Compact FieldPoint or CompactRIO systems available from National Instruments, among other types of devices. In some embodiments, similar to the system shown in FIG. 1, the computer system may couple to one or more of the instruments/devices via a network connection, such as an Ethernet connection.

Testing a Component at Multiple Frequencies Simultaneously

Figure 3:
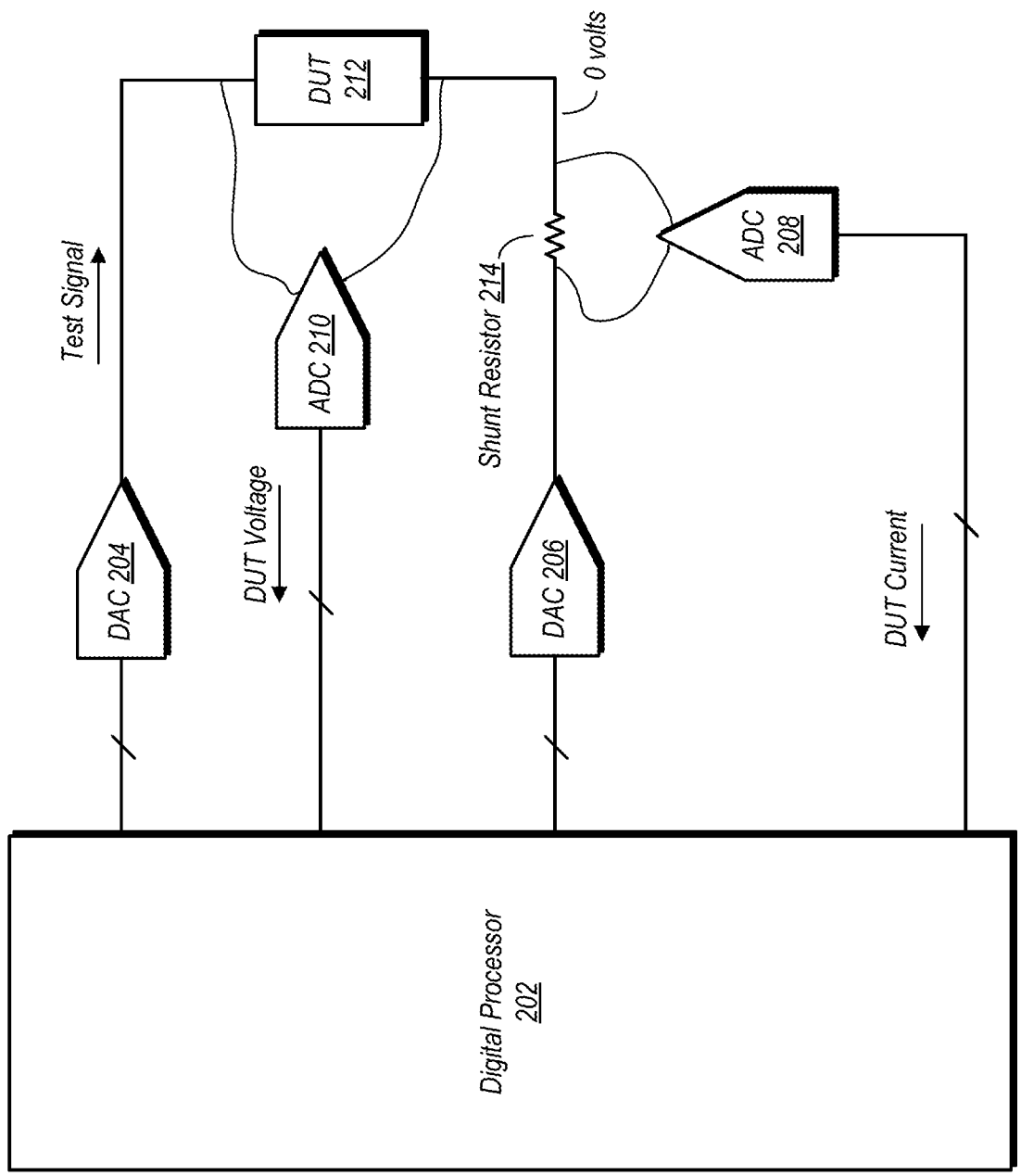
FIG. 3 is a diagram of one embodiment of a test configuration for testing a device under test (DUT) at multiple frequencies simultaneously.

FIG. 3 is a diagram illustrating one embodiment of a test configuration in which a device under test (DUT) can be tested at multiple frequencies simultaneously. In the embodiment shown, the illustrated test configuration includes a digital signal processor 202, a pair of digital-to-analog converters (DACs) 204 and 206, and a pair of analog-to-digital converters (ADCs) 208 and 210. DAC 204 in the embodiment shown is coupled to a device under test (DUT) 212, as is ADC 210. DUT 212 in the illustrated example may be a device in which the response of stimuli varies over a range of frequencies. For example, DUT 212 may be a capacitor in which the impedance decreases with frequency up to a resonant frequency, and then increases thereafter. DUT 212 may in other examples be an inductor or any other type of component or circuit that can be coupled by two different points.

Digital processor 202 in the embodiment shown may include any suitable digital processing circuitry for generating digital representations of test signals and processing digital representations of responses thereto. In one embodiment, digital processor may include a general purpose computer system, a digital signal processor, one or more application specific integrated circuits (ASICs), one or more field programmable gate arrays (FPGAs) and/or other digital circuits. Furthermore, digital processor 202 may combine multiple elements, such as a general purpose computer system with a specialized card having one or more circuits (e.g., FPGAs) explicitly designed for performing the various test operations to be discussed below. Generally speaking, digital processor 202 may implement any suitable digital circuitry or combination of digital devices/systems for carrying out the various test procedures discussed herein.

DAC 204 in the embodiment shown is coupled to apply a test signal to DUT 212. Digital processor 202 may generate a digital representation of the test signal. The digital representation may be generated in any suitable manner, such as by an inverse Fast Fourier Transform (FFT), a Taylor series approximation, and so on. The test signal to be applied to DUT 212 may be a signal having tones generated at multiple, discrete frequencies. Accordingly, the digital representation may be the test signal in digital form that, when converted to analog, includes each of the tones. As a result, DAC 204 may apply multiple tones to DUT 212 substantially simultaneously. This may allow the frequency response of DUT 212 to be determined based on the application of a single test signal, as opposed to traditional methods in which test signals of different frequencies are applied to a DUT in a sequential manner or by sweeping a test signal across a range of frequencies.

ADC 210 may be used to measure voltages across DUT 212. More particularly, since tones at a number of different frequencies are present in the test signal applied to DUT 212, ADC 210 may simultaneously capture voltages for each of these tones. The various voltages for each tone in the applied analog test signal may thus be converted into a digital signal by ADC 210 and provided to digital processor 202. The digital signal may include a number of digital values each indicative of a voltage drop across DUT 212 at the particular frequencies of the tones present in the analog test signal. Digital processor 202 may determine the voltage drops for each of the tones based on corresponding ones of the digital values.

A second ADC, ADC 208, is coupled across shunt resistor 214. Shunt resistor 214 includes a first terminal coupled to DUT 212, while a second terminal is coupled to DAC 206. In the embodiment shown DAC 206 outputs a signal that mimics certain aspects of the analog test signal output from DAC 204 in order to maintain a voltage of approximately zero volts, at the junction between DUT 212 and shunt resistor 214, for the frequencies of the various tones (it is noted that this DAC is not required for all embodiments). ADC 208 in the embodiment shown converts the voltage drops of the various tones across shunt resistor 214 into a second number of digital values. Based on these voltage drops and the resistance of shunt resistor 214, digital processor 202 may determine the current through DUT 212 at the frequency of each tone in the test signal. Thus, for each tone in the test signal, digital processor 202 may determine the impedance of DUT 212 at each corresponding frequency. More broadly, a frequency response of DUT 212 in terms of voltage, current, and impedance may be determined from the digital values provided to digital processor 202 from ADC 210 and ADC 208.

Figure 4:
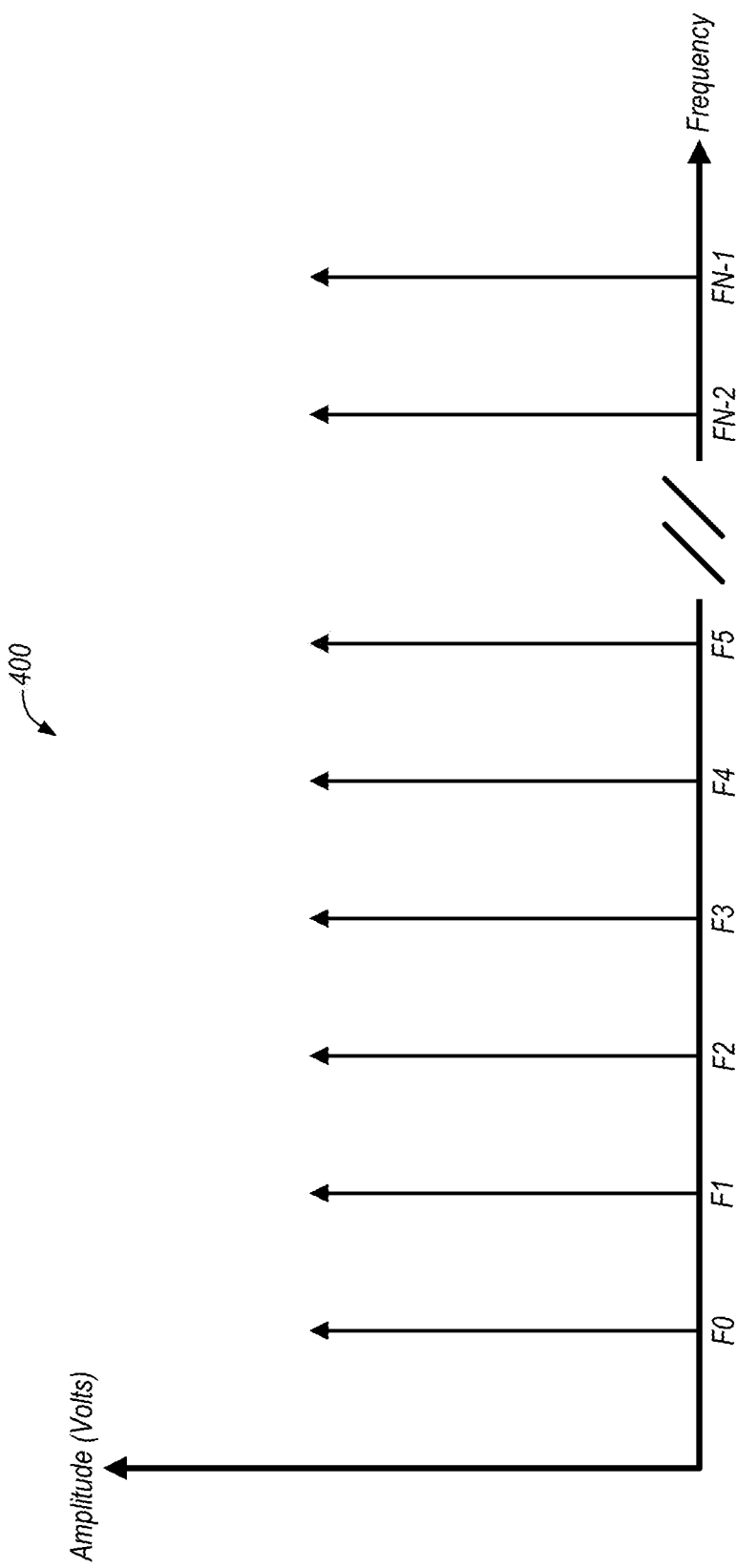
FIG. 4 is a diagram illustrating a signal, in the frequency domain, generated in one embodiment of a test configuration in order to test a DUT at multiple frequencies simultaneously.

An exemplary test signal output from DAC 204 is illustrated in FIG. 4. In the embodiment shown, test signal 400 includes a plurality of tones at different frequencies, each with the same amplitude (shown here in volts, although other units, e.g., amps, are possible and contemplated). In particular, test signal 400 includes N tones at frequencies of F0 to FN−1, wherein N is an integer number. In this particular example, the tones are spaced at relatively even intervals between a frequency of 0 and FN−1. However, in some embodiments of a test configuration, tones can be concentrated within a particular frequency band, spaced at varying intervals, or in any manner suitable for the test to be conducted. Furthermore, in some embodiments, the amplitude of at least some tones may be different with respect to other tones in test signal 400.

Generation of test signal 400 may originate in the digital domain, in particular within digital processor 202. Various mathematical techniques may be used to generate the digital representation of the test signal. Examples include an inverse FFT, a Taylor series approximation, or any other suitable mathematical technique for generating a digital representation of a test signal having multiple tones.

As previously noted, test signal 400 may be applied to a DUT such that all the tones contained therein are applied simultaneously. This may allow a DUT to be characterized for a frequency response across a range of frequencies using a single test signal with a single application of the same. As a result, characterization of the frequency response of a particular DUT may be accomplished in a very little time. In contrast, other types of test equipment (e.g., a traditional LCR meter) that only apply a single tone of a given frequency at any one time may consume more time in determining the frequency response of a DUT than various embodiments of the test configuration disclosed herein.

Figure 5:
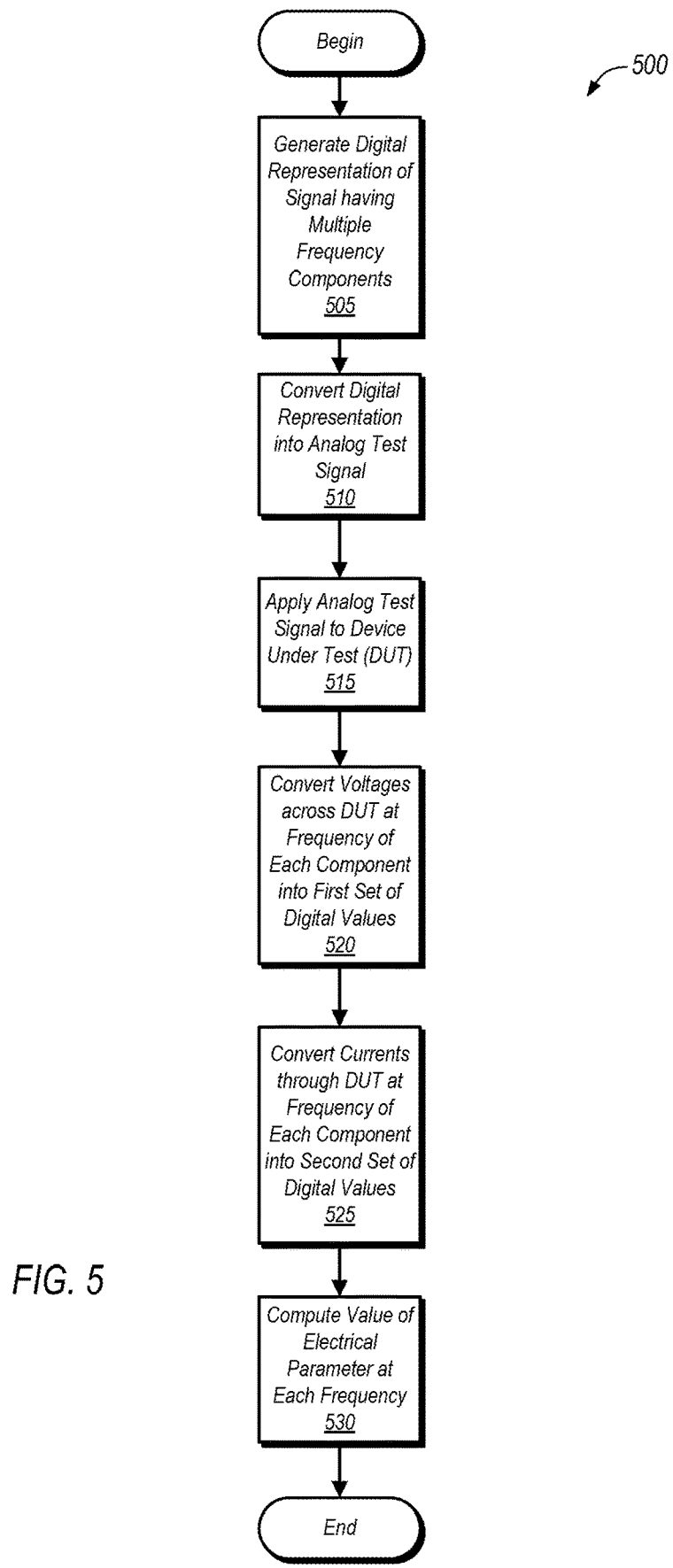
FIG. 5 is a flow diagram of one embodiment of a method for testing a DUT at multiple frequencies simultaneously.

FIG. 5 is a flow diagram illustrating one embodiment of a method for testing a DUT. Method 500 as discussed herein may be performed with any embodiment of the test configurations discussed above, as well as with test configurations not explicitly discussed herein.

Method 500 begins with the generation of a digital representation of a test signal having multiple frequency components (block 505). More particularly, the test signal represented in the digital domain may include a number of tones at different frequencies that span a range of frequencies. Generation of the digital representation may be performed by any suitable mathematical technique or combination thereof. The test signal represented in the digital domain may include tones that are evenly spaced across a range of frequencies, concentrated in a particular range around a frequency of interest, and/or other suitable configuration for the device to be tested.

In order to conduct the test, the digital representation of the test signal is provided to a DAC and converted into an analog test signal (block 510). As specified by the digital representation thereof, the analog test signal may include a number of tones at various selected frequencies. Upon conversion into the analog domain, the test signal may be applied to a DUT (block 515). The DUT may be a capacitor, an inductor, other discrete component, or may be a circuit that includes multiple components. The test may be conducted to determine a frequency response of the DUT. Since the test signal in the analog domain include a number of tones at various frequencies, its application to the DUT effectively applies these tones thereto simultaneously. That is, instead of applying different tones to the DUT in a sequential manner, each tone is applied to the DUT at the same time, which may result in a relatively quick test.

Upon applying the analog test signal to the DUT, the voltages at each frequency component (in particular, the tones discussed above) may be converted, by an ADC, into a first set of digital values (block 520). That is, the voltage drop across the DUT at the frequency of each tone may be captured in a signal that is converted back into the digital domain. Additionally, current through the DUT at the frequency of each component in the analog test signal, including the frequencies of the tones, may be converted into a second set of digital values (block 525). In one embodiment, converting the currents may comprise receiving analog voltage signals across a shunt resistor connected in series with the DUT, converting these analog voltage signals into the digital domain, and calculating the currents based on the resistance of the shunt resistor and the voltages at the tones in the analog test signal.

Thus, in blocks 520 and 525, the voltage across and the current through the DUT at the frequency of each tone may be captured and converted into the digital domain. The voltage and current values may then be used to determine the value of an electrical parameter at the frequency of each of the tones (block 530). For example, in one embodiment the DUT is a capacitor, and the electrical parameter is an impedance that is determined for a range of frequencies in accordance with the frequencies of the tones in the analog test signal. Additional electrical parameters may also be determined in some cases (e.g., a resonant frequency of a capacitor). Given a sufficiently large range of frequencies for the tones in the analog test signal, a characterization of the DUT may be performed.

Figure 6:
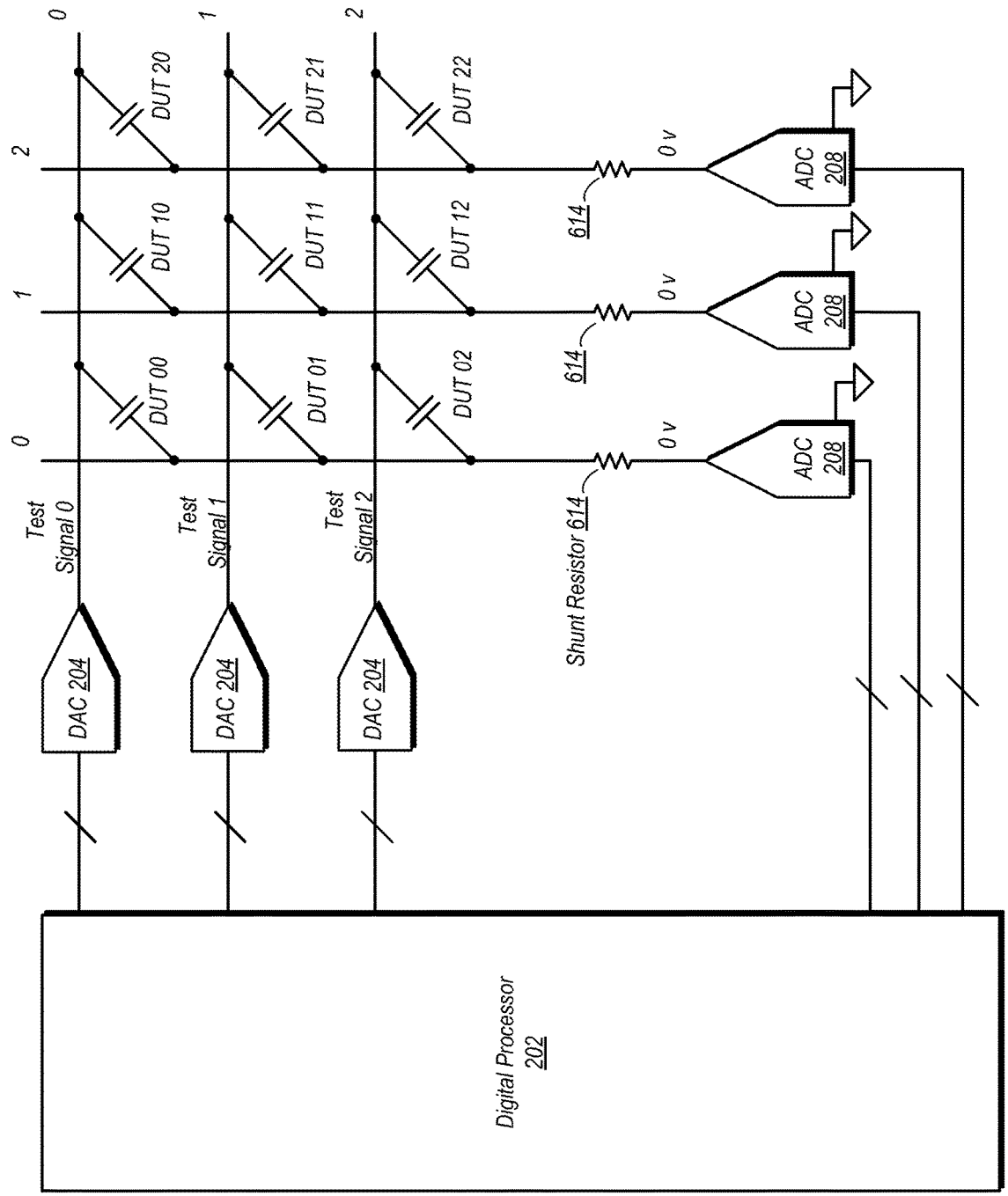
FIG. 6 is a diagram of one embodiment of a test configuration for testing a plurality of DUTs simultaneously, with each DUT being tested at multiple frequencies simultaneously.

The ability to simultaneously apply a number of tones in an analog signal to a DUT may be leveraged to test a number of components simultaneously. FIG. 6 is a diagram of one embodiment of a test configuration for testing a plurality of DUTs simultaneously, with each DUT being tested at multiple frequencies simultaneously. Thus, in the test configuration of FIG. 6, there are two levels of simultaneousness. The first level is that multiple tones of different frequencies with respect to each other are simultaneously applied to each DUT. The second level is that the analog test signals are applied to the DUTs simultaneously. Thus, a number of components may be tested across a range of frequencies in a short amount of time.

In the embodiment shown, nine capacitors are arranged in a 3×3 matrix to be simultaneously tested. It is noted that the size of the matrix is exemplary, and that DUTs can be arranged in a matrix of any feasible size (e.g., 10×10). Furthermore, it is not necessary that a matrix be square. Each DUT includes a first node coupled to a corresponding row and a second node coupled to a corresponding column. No two DUTs in the arrangement shown are coupled between both the same row and same column. The DUTs in the embodiment shown, are labeled by their respective row and column. For example, DUT 01 is in column 0, row 1, while DUT 12 is in column 1, row two.

The test configuration shown here includes three DACs 204 and three ADCs 208. It is noted that test configurations in which each DUT is connected a manner similar to that shown in FIG. 3 are possible and contemplated within the matrix configuration illustrated here. That is, another set of DACs may be included and may perform the same role as in the embodiment shown in FIG. 3. Similarly, configurations may be implemented with two sets of ADCs, one to convert voltage drops across DUTs into the digital domain, and another set to convert voltages across shunt resistors into the digital domain to enable current calculations. The test signals may be applied simultaneously from the DACs 204 to their respectively coupled DUTs. Similarly, the responses may be simultaneously received and converted to digital by respectively coupled ADCs 208.

In the illustrated example, three instances of DAC 204 are provided, with each DAC 204 coupled to provide an analog test signal to each DUT in a particular row. Thus, the uppermost DAC in the example shown provides an analog test signal to DUT 00, DUT 10, and DUT 20. As with the exemplary embodiment of FIG. 3, the analog test signal may include a number of tones at different frequencies, and thus each DUT in a given row may receive each of the tones simultaneously. It is noted, however, that the analog test signal provided by a given DAC 204 in this example has a unique set of tones with respect to the analog test signals provided by each of the other DACs 204. For example, the DAC 204 coupled to row 0 may provide Test Signal 0, which has a first set of tones, while the DAC 204 coupled to row 1 may provide Test Signal 1, which has a second set of tones. The respective frequencies of the tones of the first set are different with respect to the frequencies of the tones of the second set. Similarly, the frequencies of the tones of Test Signal 2 are different from those of Test Signal 0 and Test Signal 1. Thus, each row of DUTs in the illustrated example may receive an analog test signal that is unique with respect to the analog test signals received by the DUTs of other rows. As is further explained below, this may allow for positional discrimination between the various DUTs to enable the simultaneous testing of all DUTs in the matrix.

Generation of the test signals may originate in digital processor 202, and may be performed in any suitable manner (such as those discussed above with reference to FIG. 3). The digital representation for each analog test signal may be provided to a corresponding one of DACs 204 and converted into the analog domain. The analog test signal from each DAC 204 may then be applied to the DUTs of its correspondingly coupled row.

The test configuration shown in FIG. 6 further includes a number of ADCs 208, each of which is coupled to a corresponding column. Each ADC 208 is coupled to receive currents from each of the DUTs in its respective column. The currents received by each ADC 208 may include frequency components for each of the analog test signals provided to the DUTs of the matrix. For example, ADC 208 coupled to column 0 may receive currents for the respective tones of each of Test Signals 0, 1, and 2. However, for a given set of tones, currents received by a given ADC 208 are associated with only one of the DUTs. For example, the ADC 208 associated with column 0 is coupled to receive currents passing through DUT 00, DUT 01, and DUT 02. Test Signal 0 is applied to DUT 00. Thus, currents at the frequencies of the tones in Test Signal 0, as received by the ADC 208 coupled to column 0, are associated with DUT 00. The currents at the frequencies of the tones in Test Signal 1 received by ADC 208 coupled to column 0 are those passing through DUT 01, and so on. Accordingly, ADC 208 coupled to column 0 receives currents passing through DUTs 00, 01, and 02, from Test Signals 0, 1, and 2, respectively. ADC 208 coupled to column 1 receives currents passing through DUTs 10, 11, and 12, from Test Signals 0, 1, and 2, respectively. ADC 208 coupled to column 2 receives currents passing through DUTs 20, 21, and 22 from Test Signals 0, 1, and 2 respectively.

The currents received by each ADC 208 may be converted from their analog form as received into respective sets of digital values. Since there is an association between each DUT, the ADC 208 through which its current was received and converted to digital, and which of the test signals the DUT received (and thus, the corresponding tones applied thereto), digital processor 202 may perform positional discrimination between the various DUTs. Thus, in accordance with the above, digital processor 202 may determine that digital values associated with frequencies of the tones of Test Signal 0, as received by ADC 208 coupled to column 0, are indicative of the response of DUT 00 to test stimuli. To give another example, digital processor 202 may determine that digital values associated with the frequencies of the tones of test signal 1, as received by the ADC 208 coupled to column 2, are indicative of the response of DUT 21. Thus, the digital values received from the ADC 208 by digital processor 202 include response information for each of the DUTs of the matrix. Based on the ADC 208 from which a digital value was received, and the frequency components therein (i.e. the frequencies of the tones), digital processor 202 can determine to which DUT the response is associated.

Thus, the test configuration shown in FIG. 6 may allow the various DUTs shown therein to be tested simultaneously with one another. Furthermore, the frequency response of each DUT may be determined by simultaneously applying tones of a number of different frequencies thereto. This may allow for quick testing of a number of DUTs.

Figure 7:
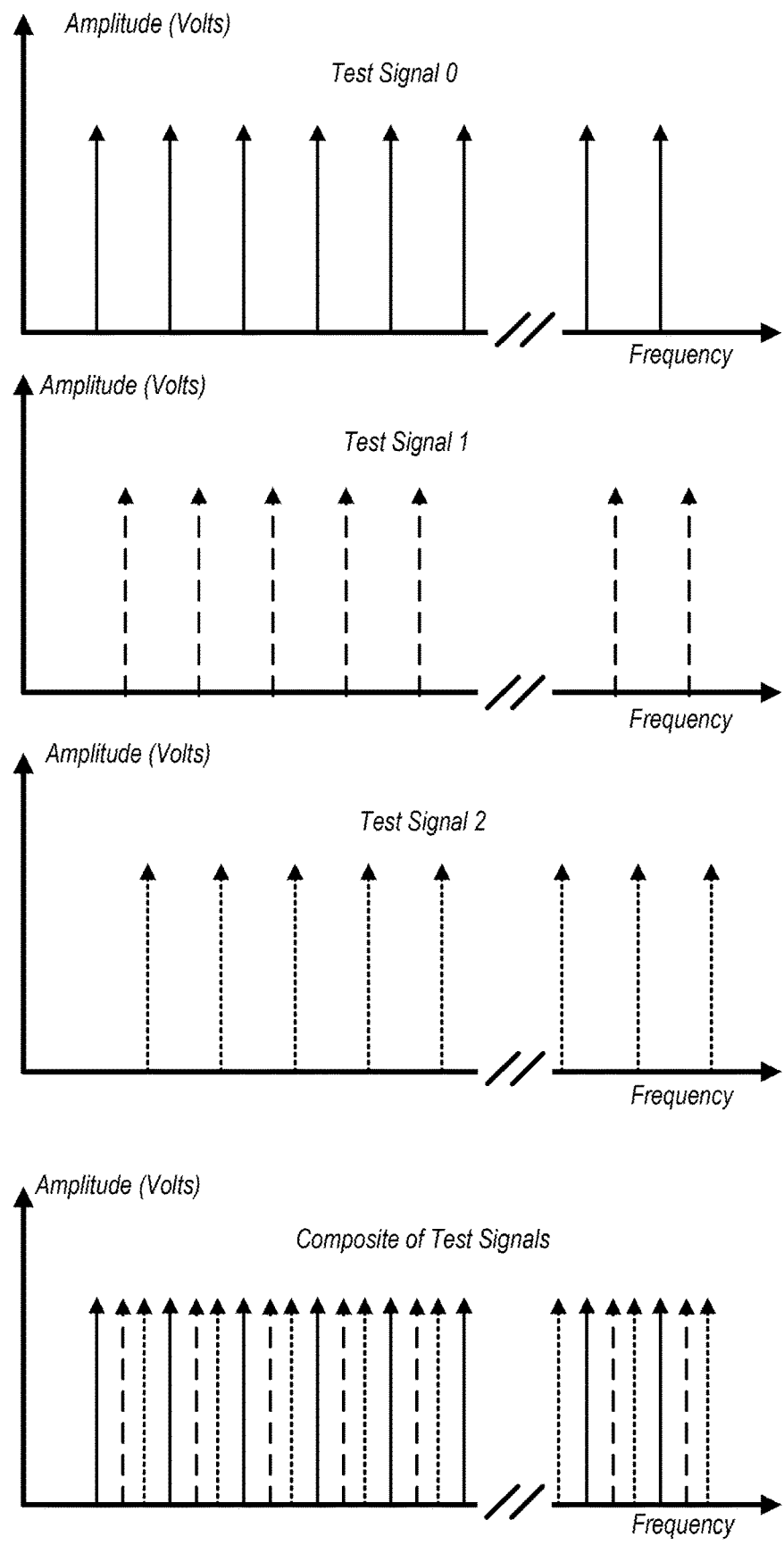
FIG. 7 is a diagram illustrating a number of signals, in the frequency domain, to enable one embodiment of a test configuration to test multiple DUTs simultaneously, with each DUT being tested at multiple frequencies simultaneously.

FIG. 7 is an exemplary graphic illustration of a number of different test signals that may be applied to the various DUTs. Test Signal 1 includes a number of tones that are applied to DUTs in row 0. Test Signal 1 includes a number of tone that are applied to DUTs. However the tones of Test Signal 1 are offset in frequency from those of Test Signal 0. That each, each tone of Test Signal 1 is different in frequency than those of Test Signal 0. Furthermore, the tones of Test Signal 2 are offset in frequency from those of Test Signals 0 and 1. Thus each test signal has a set of tones that are unique in frequency with respect to the tones of the other test signals.

The amount of offset between the tones of one test signal and the others may vary from one embodiment to the next. Generally speaking, the amount of offset may be chosen such the frequency of a given tone in one test signal can be discriminated from that of a tone in another test signal.

A composite of the test signals is also shown in FIG. 7. In terms of frequency, the composite of the test signals is what is seen and converted from analog to digital by each of the ADCs (the amplitudes of the various tones may vary from one to another, depending on the amount of voltage drop across the DUT to which it was applied). Since each tone of the composite test signal shown is applied to only one DUT, digital processor 202 can determine which DUT to which a particular tone was applied. This in turn enables digital processor 202 to discriminate between the various DUTs when determining their respective responses to the applied test signals.

Figure 8:
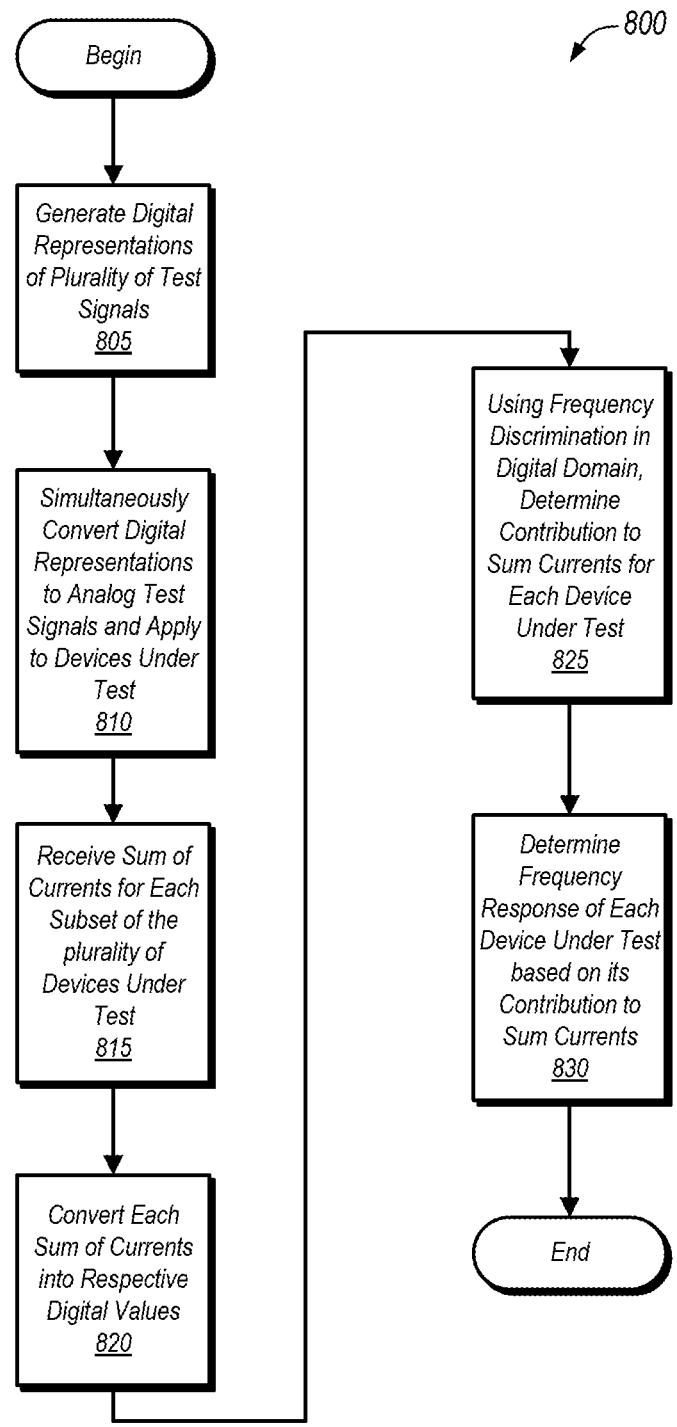
FIG. 8 is a flow diagram illustrating one embodiment of a method for testing a plurality of DUTs simultaneously, with each DUT being tested at multiple frequencies simultaneously.

FIG. 8 is a diagram illustrating a number of signals, in the frequency domain, to enable one embodiment of a test configuration to test multiple DUTs simultaneously, with each DUT being tested at multiple frequencies simultaneously. Method 800 may be performed with the test configuration shown in FIG. 5, as well as a wide variety of variations of the same. In generally, method 800 may be performed with any test configuration in which test signals are applied to multiple DUTs simultaneously, with each DUT having multiple tones of a test signal simultaneously applied thereto.

Method 800 begins with the generation of digital representations of a plurality of test signals (block 805). The digital representation may be generated using any of the various mechanisms discussed above. Each of the test signals may include a plurality of tones of different frequencies as shown in FIG. 7. Furthermore the frequencies of the tones in a given one of the test signals may be unique with respect to the frequencies of the tones in the other test signals.

Subsequent to their generation in the digital domain, the digital representations of the test signals may be simultaneously converted into analog test signals and applied to DUTs of the test configuration (block 810). The application of a test signal to a particular DUT may simultaneously apply tones of a number of different frequencies thereto.

Currents from the DUTS may be received by correspondingly coupled ADCs. Each ADC may receive a sum of currents passing through a number of DUTs (block 815). Each of the sum currents may be converted into corresponding pluralities of digital values by the ADC at which it is received (block 820).

Upon converting sum currents to the digital domain, a digital processor may use frequency discrimination (e.g., through the use of digital filtering) to determine the contribution to a given sum current by each DUT (block 825). Based on contribution to a sum current of each of the DUTs (and their corresponding digital values), a frequency response for each DUT may then be determined (block 830).

Numerous variations and modifications will become apparent to those skilled in the art once the above disclosure is fully appreciated. It is intended that the following claims be interpreted to embrace all such variations and modifications.

What is claimed is:
1. An apparatus comprising:
  a first digital-to-analog converter (DAC) configured to convert a first digital signal into a first analog signal and further configured to apply the first analog signal to a first plurality of devices under test (DUTs) arranged in a first row of a matrix, the first analog signal having a first plurality of frequencies;

a second DAC configured to convert a second digital signal into a second analog signal and further configured to apply the second analog signal to a second plurality of DUTs arranged in a second row of a matrix, the second analog signal having a second plurality of frequencies different from ones of the first plurality of frequencies;

a first analog-to-digital converter (ADC) configured to convert a first plurality of currents received from a first one of the first plurality of DUTs and a first one of the second plurality of DUTs into a first plurality of digital values;

a second ADC configured to converter a second plurality of currents received from a second one of the first plurality of DUTs and a second one of the second plurality of DUT into a second plurality of digital values; and a digital signal processing circuit configured to determine, concurrently, respective values of an electrical parameter at the first plurality of frequencies for the first plurality of DUTs and at the second plurality of frequencies for the second plurality of DUTs using the first and second pluralities of digital values.

2. The apparatus as recited in claim 1, wherein the value of an electrical parameter is an impedance, and wherein the digital signal processing circuit is configured to determine an impedance value for DUTs of the first and second pluralities of DUTs at frequencies of the first and second pluralities of frequencies, respectively.

3. The apparatus as recited in claim 1, wherein the first plurality of digital values are representative of currents through a DUT of the first plurality of DUTs and a DUT of the second plurality of DUTs, arranged in a first column of the matrix, at the first plurality of frequencies and the second plurality of frequencies, respectively.

4. The apparatus as recited in claim 3, wherein the second plurality of digital values are representative of currents through a DUT of the first plurality of DUTs and a DUT of the second plurality of DUTs, arranged in a second column of the matrix, at first and second frequencies, respectively.

5. The apparatus as recited in claim 1, further comprising a first resistor coupled to the first ADC and a DUT in a first column of the matrix and a second resistor coupled to the second ADC and a DUT in a second column of the matrix.

6. The apparatus as recited in claim 1, wherein the digital processing circuit is further configured to generate the first digital signal and the second digital signal using an inverse Fast Fourier Transform (FFT).

7. The apparatus as recited in claim 1, wherein the digital processing circuit is configured to generate the first digital signal and the second digital signal using a Taylor series approximation.

8. The apparatus of claim 1, wherein ones of the frequencies of the first plurality of frequencies are different from ones of the frequencies of the second plurality of frequencies.

9. The apparatus of claim 1, further comprising a plurality of ADCs separate from the first and second ADCs, wherein ones of the plurality of ADCs are configured to measure voltages across correspondingly coupled ones of the plurality of DUTs.

10. A method comprising:

converting a first digital signal into a first analog signal and a second digital signal into a second analog signal using first and second digital-to-analog converters (DACs), respectively, the first and second analog signals having first and second pluralities of frequencies, respectively;

applying the first analog signal and the second analog signal to first and second pluralities of devices under test (DUTs), respectively, the first and second pluralities of DUTs being arranged in first and second rows, respectively, of a matrix;

converting currents through a first one of the first plurality of DUTs and a first one of the second plurality of DUTs into a first plurality of digital values;

converting currents through a second one of the first plurality of DUTs and a second one of the second plurality of DUTs into a second plurality of digital values; and concurrently determining respective values of an electrical parameter at each of the first and second pluralities of frequencies for the first and second pluralities of DUTs using the first and second pluralities of digital values.

11. The method as recited in claim 10, wherein the value of an electrical parameter is an impedance, and wherein the method further comprises determining respective impedance values for the first plurality of DUTs at ones of the first plurality of frequencies and ones of the second plurality of DUTs at ones of the second plurality of frequencies using the first and second pluralities of digital values.

12. The method as recited in claim 10, wherein ones of the first plurality of digital values are representative of currents through a first DUT of the first plurality of DUTs and a first DUT of the second plurality of DUTs, arranged in a first column of the matrix, at a corresponding ones of the first and second pluralities of frequencies, respectively.

13. The method as recited in claim 12, wherein ones of the second plurality of digital values are representative of currents through a second DUT of the plurality of DUTs and a second DUT of the second plurality of DUTs, arranged in a second column of the matrix, at a corresponding ones of the first and second pluralities of frequencies, respectively.

14. The method as recited in claim 10, further comprising digital processing circuitry generating the first and second digital signals using an inverse Fast Fourier Transform.

15. The method as recited in claim 10, further comprising digital processing circuitry generating the first and second digital signals using a Taylor Series approximation.

16. A system comprising:

a test system configured simultaneously measure
a frequency dependent electrical parameter of a plurality of devices under test (DUTs) having first and second subsets arranged in first and second rows of a matrix, respectively, wherein the test system includes:

a first digital-to-analog converter (DAC) configured to convert a first digital signal into a corresponding first analog signal having a first plurality of frequencies, and further configured to provide the first analog signal to the first subset of DUTs;

a second DAC configured to convert a second digital signal into a corresponding second analog signal having a second plurality of frequencies, and further configured to provide the second analog signal to the second subset of DUTs;

a first analog-to-digital converter (ADC) configured to concurrently convert currents received from first column of the matrix, the first column including a first DUT of the first subset and a first DUT of the second subset, into a first plurality of digital values;

a second ADC configured to concurrently convert currents received from a second column of the matrix, the second column including a second DUT of the first subset and a second DUT from the second subset, into a second plurality of digital values; and digital processing circuitry is configured to determine respective values of the electrical parameter at the first plurality of frequencies for the first plurality of DUTs and at the second plurality of frequencies for the second plurality of DUTs using the first and second pluralities of digital values.

17. The system as recited in claim 16, further comprising a first resistor coupled to the first ADC and a first column of the matrix and a second resistor coupled to the second ADC and a second column of the matrix.

18. The system of claim 16, wherein the digital processing circuitry is further configured to generate the first digital signal and the second digital signal using an inverse Fast Fourier Transform (FFT).

19. The system of claim 16, wherein the digital processing circuitry is further configured to generate the first digital signal and the second digital signal using a Taylor series approximation.

20. The system of claim 16, wherein ones of the first plurality of frequencies are different from ones of the second plurality of frequencies.

* * * * *

UNITED STATES PATENT AND TRADEMARK OFFICE
CERTIFICATE OF CORRECTION

PATENT NO. : 10,838,000 B2
APPLICATION NO. : 15/922051
DATED : November 17, 2020
INVENTOR(S) : Blake A. Lindell and Pablo E. Limon-Garcia-Viesca Page 1 of 1

It is certified that error appears in the above-identified patent and that said Letters Patent is hereby corrected as shown below:

In the Claims

Column 11, Claim 1, Line 15, please delete "to converter a second" and insert -- to convert a second --.

Signed and Sealed this
Second Day of March, 2021

Drew Hirshfeld
*Performing the Functions and Duties of the
Under Secretary of Commerce for Intellectual Property and
Director of the United States Patent and Trademark Office*